(12) United States Patent
Takada et al.

(10) Patent No.: US 8,476,102 B2
(45) Date of Patent: Jul. 2, 2013

(54) SOLID STATE IMAGE PICKUP DEVICE AND METHOD FOR MANUFACTURING SOLID STATE IMAGE PICKUP DEVICE

(75) Inventors: Hideaki Takada, Yokohama (JP); Toru Koizumi, Yokohama (JP); Yasuo Yamazaki, Sagamihara (JP); Tatsuya Ryoki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 217 days.

(21) Appl. No.: 13/029,046

(22) Filed: Feb. 16, 2011

(65) Prior Publication Data

US 2011/0198718 A1 Aug. 18, 2011

(30) Foreign Application Priority Data

Feb. 18, 2010 (JP) ................. 2010-033854

(51) Int. Cl.
*H01L 21/00* (2006.01)

(52) U.S. Cl.
USPC ............ 438/73; 438/75; 438/78; 438/81; 257/431; 257/443; 257/444; 257/446; 257/E27.122; 257/E27.127; 257/E27.13; 257/E27.134; 257/E31.053; 257/E31.054; 257/E31.055; 257/215

(58) Field of Classification Search
None
See application file for complete search history.

(56) References Cited

U.S. PATENT DOCUMENTS

| 2003/0085399 A1* | 5/2003 | Inagaki ..................... 257/53 |
| 2005/0269604 A1 | 12/2005 | Koizumi |
| 2006/0163684 A1* | 7/2006 | Nakamura et al. ........... 257/462 |
| 2008/0157074 A1* | 7/2008 | Bernstein ..................... 257/48 |

FOREIGN PATENT DOCUMENTS

| JP | 2006-024907 A | 1/2006 |
| WO | 2009/123244 A1 | 10/2009 |

* cited by examiner

*Primary Examiner* — Fei Fei Yeung Lopez
(74) *Attorney, Agent, or Firm* — Canon U.S.A., Inc. IP Division (57) ABSTRACT

A method for manufacturing a solid state image pickup device including a first active region provided with a first conversion unit, a second active region provided with a second conversion unit, and a third active region adjoining the first and the second active regions with a field region therebetween and being provided with a pixel transistor, the method including the steps of ion-implanting first conductivity type impurity ions to form a semiconductor region serving as a potential barrier against the signal carriers at a predetermined depth in the third active region and ion-implanting second conductivity type impurity ions into the third active region with energy lower than the above-described ion-implantation energy.

25 Claims, 5 Drawing Sheets

SOLID STATE IMAGE PICKUP DEVICE AND METHOD FOR MANUFACTURING SOLID STATE IMAGE PICKUP DEVICE

BACKGROUND OF THE INVENTION

1. Field of the Invention

The present invention relates to a solid state image pickup device and a method for manufacturing a solid state image pickup device. In particular, the present invention relates to a pixel transistor configuration.

2. Description of the Related Art

An APS type solid state image pickup device is mentioned as one of solid state image pickup devices used for digital cameras and the like. Regarding the solid state image pickup device, reduction in pixel pitch to increase the number of pixels has advanced and reduction in leakage of carriers to adjacent pixels (color mixture) has been studied, the leakage being caused by the pitch reduction.

Regarding the leakage of carriers to adjacent pixels, for example, a configuration is known, in which a semiconductor region having polarity reverse to the polarity of a signal carrier is disposed between adjacent photoelectric conversion units. A potential barrier against a signal carrier is formed by such a configuration, and leakage to adjacent pixels or adjacent photoelectric conversion units is suppressed.

Japanese Patent Laid-Open No. 2006-024907 discloses a specific configuration of a potential barrier in the case where a structure, which improves the quantum efficiency of photoelectric conversion by deepening a P-type well region constituting a part of a photoelectric conversion unit, is formed.

Regarding the plane layout disclosed in Japanese Patent Laid-Open No. 2006-024907, if the reduction in pixel pitch advances, further study is in order because of the following points.

In order to maintain the sensitivity even when the light-receiving area of the photoelectric conversion unit is reduced, it is desirable that areas occupied by a pixel transistor and the potential barrier are reduced while the light-receiving area is maintained.

In general, in the case where the potential barrier disclosed in Japanese Patent Laid-Open No. 2006-024907 is formed deeply in a semiconductor substrate, formation is performed through high energy ion implantation. At this time, an opening of a resist mask for ion implantation is in the shape having a high aspect ratio. If a mask shape having a high aspect ratio is employed, "sagging" of the frontage shape of the opening may occurs and, thereby, the film thickness of the resist mask in the vicinity of the opening may be reduced. Consequently, unintended impurity ions may be implanted into the region in the vicinity of the substrate surface.

Furthermore, regarding the incident angle in the ion implantation, there is a certain angle with respect to the direction of the normal to the substrate in many cases. Among impurity ions implanted through a narrow opening of the resist mask, impurity ions implanted at small angles with respect to the substrate surface are decelerated by repetition of reflection at and collision with the side wall of the resist mask. Unintended impurity ions may also be implanted into the region in the vicinity of the substrate surface because of such a phenomenon.

As described above, if the width of the potential barrier formed at a deep position from the surface of the semiconductor substrate is reduced, influences of unintended impurity ions implanted into a shallow region of the substrate surface and the vicinity of the opening region become not neglected.

Impurity ions implanted into a shallow position from the substrate surface may change the characteristics, e.g., a threshold value, of the transistor from a design value. The deviation of the threshold value of the pixel transistor from the design value has influences on the characteristics of a solid state image pickup device. For example, a desired carrier transfer characteristic is not obtained, or a wide dynamic range is not obtained.

SUMMARY OF THE INVENTION

Aspects of the present invention provide a method for manufacturing a solid state image pickup device including a plurality of pixels, which includes conversion units to generate signal carriers and at least one pixel transistor to read signals based on the generated signal carriers, a first active region provided with a first conversion unit, a second active region provided with a second conversion unit, and a third active region adjoining the above-described first and the second active regions with a field region therebetween and being provided with the above-described pixel transistor, the method including ion-implanting first conductivity type impurity ions to form a semiconductor region serving as a potential barrier against the signal carriers at a predetermined depth in the third active region and ion-implanting second conductivity type impurity ions with energy lower than an implantation energy of the ion-implanting of the first conductivity type impurity ions into a region serving as a channel portion of the pixel transistor in the above-described third active region.

Further features of the present invention will become apparent from the following description of exemplary embodiments with reference to the attached drawings.

DESCRIPTION OF THE EMBODIMENTS

In the following aspect of embodiment, variations in characteristics of a pixel transistor associated with miniaturization of a potential barrier to isolate between adjacent pixels may be suppressed.

Figure 1A:
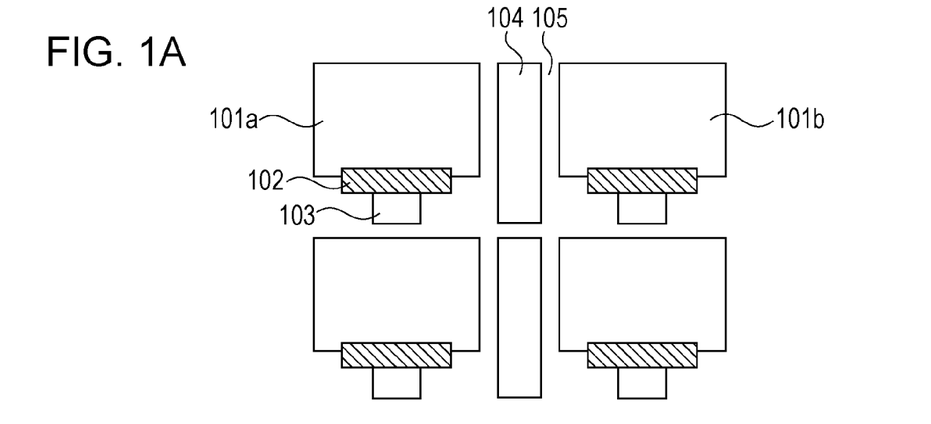
FIGS. 1A to 1C are schematic diagrams of a plane layout of a solid state image pickup device according to an embodiment of the present invention.
Figure 1B:
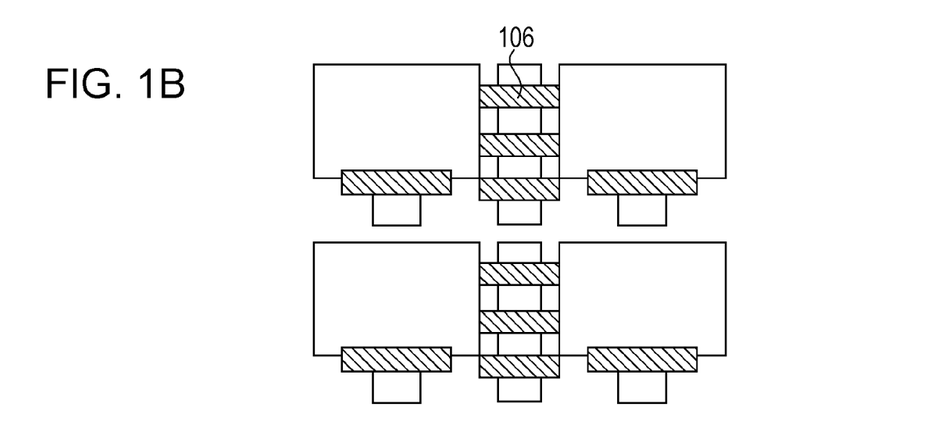
Figure 1C:
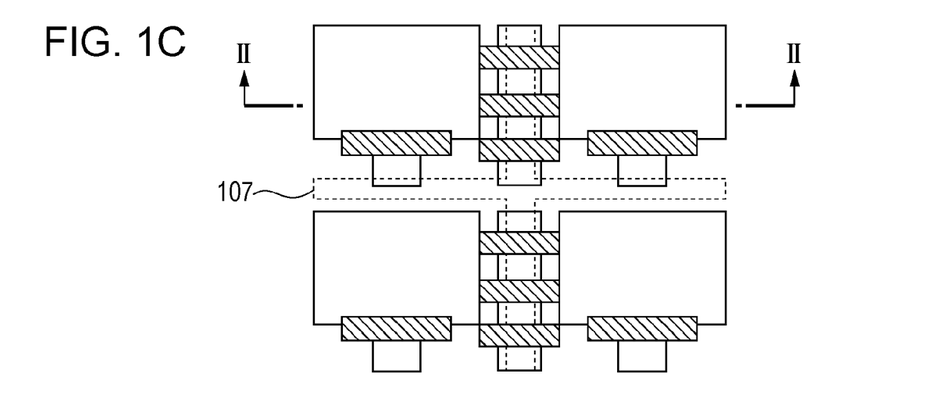

FIGS. 1A to 1C are schematic diagrams of a plane layout of a solid state image pickup device according to an embodiment of the present invention. In the configuration, a plurality of pixels is included. In the following explanations, the configuration in which an electron is used as the signal carrier will be described. In the case where a hole is used as the signal carrier, the conductivity type of each semiconductor region is changed to a reverse conductivity type.

FIG. 1A is a schematic plan view. In FIG. 1A, only the gate of a transfer transistor is shown and gate electrodes of other pixel transistors are excluded in order to show the boundary between active regions and a field region.

FIG. 1B is a schematic plan view, wherein gate electrodes of pixel transistors are disposed in FIG. 1A. Here, examples of pixel transistors include an amplifying transistor to amplify signals generated in a photoelectric conversion unit, a selection transistor to select a pixel on a line basis, and a reset transistor to reset the potential of an input node of the amplifying transistor. All transistors contribute to reading of signals based on the signal carriers generated in the photoelectric conversion units.

FIG. 1C is a schematic plan view, wherein a P type (first conductivity type) semiconductor region (first semiconductor region) serving as a potential barrier disposed under a field region between adjacent photoelectric conversion units is shown in FIG. 1B.

In these drawings, pixels are arranged in 2 rows and 2 columns, but still more pixels are disposed in practice. Here, it is assumed that the pixel includes a photoelectric conversion unit and at least one pixel transistor.

In FIGS. 1A to 1C, diagonally shaded regions are gate electrode layers of transistors. The whole electrode layer is formed from a portion disposed on an active region serving as a channel of the transistor and a portion disposed on the field region.

In FIG. 1A, reference numerals 101a and 101b denote active regions provided with photoelectric conversion units. Among semiconductor regions constituting the photoelectric conversion units, the positions of arrangement of N-type semiconductor regions exhibiting the same polarity as that of the signal carrier are schematically shown in the drawing. Reference numeral 101a denotes a first active region provided with a first photoelectric conversion unit, and reference numeral 101b denotes a second active region provided with a second photoelectric conversion unit.

Reference numeral 103 denotes an active region provided with a floating diffusion region (FD region). The FD region is electrically connected to a gate of the amplifying transistor. The FD region is formed from an N-type semiconductor region.

Reference numeral 102 denotes a transfer gate to transfer carriers in the photoelectric conversion unit to the FD region 103.

Reference numeral 104 denotes a third active region provided with source•drain regions and a channel of a pixel transistor. In the case where the pixel transistor is an NMOS transistor, the source•drain regions are formed from N-type semiconductor regions. The third active region adjoins to the first and the second active regions with a field region 105, as described below, therebetween. The third active region 104 is provided with source•drain regions of a plurality of pixel transistors.

Reference numeral 105 denotes the field region formed from an insulating material. The field region 105 is disposed between the first and the second active regions provided with the photoelectric conversion units and the third active region provided with the pixel transistors. The field region 105 can be formed from LOCOS or STI.

In FIG. 1B, reference numeral 106 denotes a gate electrode of a pixel transistor. The gate electrode of any one of the transistors constituting the above-described pixel transistor is disposed. In FIG. 1B, two gate electrodes are further disposed at the positions under the position of the gate electrode 106. These three gate electrodes are the gate electrodes of the above-described plurality of pixel transistors.

In FIG. 1C, reference numeral 107 denotes a P-type semiconductor region serving as a potential barrier against signal carriers. The P-type semiconductor region 107 is disposed at a predetermined depth in the third active region, and may be extended under a part of the first and the second active regions. The P-type semiconductor region 107 may be formed from one semiconductor region or be formed from a plurality of semiconductor regions disposed at different depths. The P-type semiconductor region 107 has an impurity concentration higher than that of a surrounding P-type well. Specific impurity concentration is different depending on a pixel pitch and the like. However, for example, the concentration of $1 \times 10^{17}$ or more is favorable.

In order to maintain or improve the sensitivity and the saturation carrier number in the photoelectric conversion unit, the potential barrier can be disposed at a certain distance from the N-type semiconductor region constituting the photoelectric conversion unit. This is because the P-type semiconductor region 107 is formed from a P-type semiconductor region having a high impurity concentration, as described above. If the P-type semiconductor region having a high impurity concentration is disposed close to the N-type semiconductor region constituting the photoelectric conversion unit, P-type impurity ions are diffused by a heat treatment during a production process, so that the area and the volume of the N-type semiconductor region constituting the photoelectric conversion unit may be reduced. This has an influence on the sensitivity and the saturation carriers of the photoelectric conversion unit.

Furthermore, in order to ensure the sensitivity on the long wavelength side, the N-type semiconductor region constituting the photoelectric conversion unit and the P-type well constituting a PN junction can be disposed at a position satisfying $4\ \mu m \leq D1 \leq 5\ \mu m$, where the depth from the substrate surface is assumed to be D1. The P-type semiconductor region 107 serves as a potential barrier against the signal carriers and, therefore, can be disposed up to at least a depth equal to the depth of the P-type well.

An N-type (second conductivity type) impurity ion-implanted region, which is a feature of the present invention, is disposed as an upper portion of the P-type semiconductor region 107. The N-type impurity ion-implanted region is a region disposed to adjust the characteristics of the pixel transistor. The characteristics are, for example, a threshold value. The N-type impurity ion-implanted region can be formed by using the same mask as a resist mask for forming the P-type semiconductor region 107 with ion implantation energy lower than that in the formation of the P-type semiconductor region 107. The N-type impurity ion-implanted region can suppress changes in characteristics of the pixel transistor due to P-type impurity ions incidentally implanted into the substrate surface during ion implantation in formation of the P-type semiconductor region 107. Here, the conductivity type of practical semiconductor region (NET concentration) is either P-type or N-type insofar as the N-type impurity ion concentration is higher than that in the case where only P-type impurity ions are disposed. Alternatively, in the case where a substrate in which an N-type epitaxial layer is grown on an N-type semiconductor substrate is used, it is enough that the concentration is higher than the impurity ion concentration of the N-type epitaxial layer.

Figure 2:
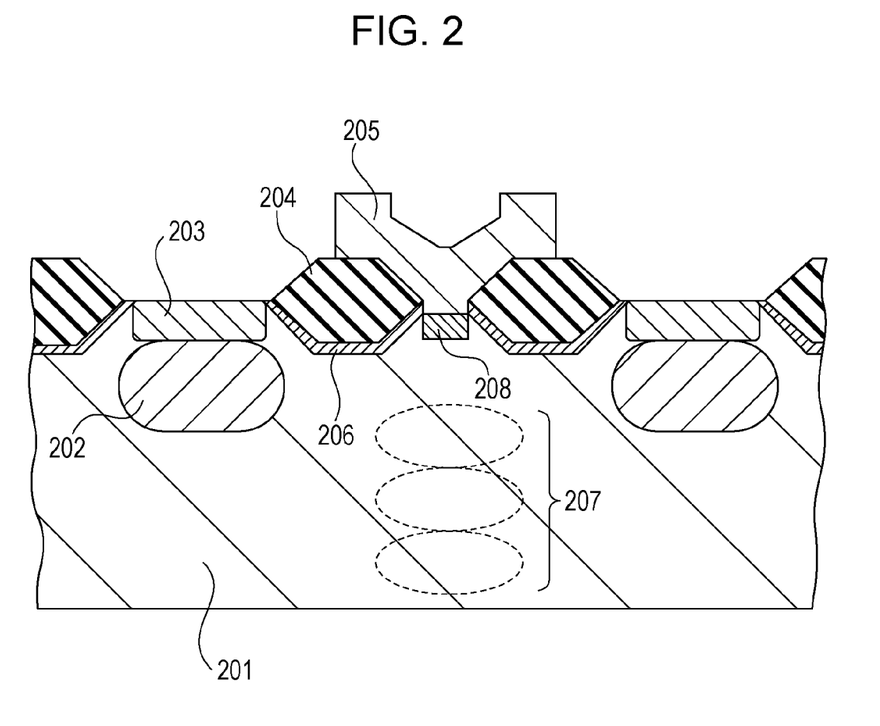
FIG. 2 is a sectional view of a section taken along a line II-II shown in FIG. 1C.

FIG. 2 is a schematic sectional view of a section taken along a line II-II shown in FIG. 1C. Reference numeral 201 denotes a P-type well. A P-type semiconductor region formed on an N-type semiconductor substrate can be used, or a P-type semiconductor substrate can also be used as-is.

Reference numeral 202 denotes an N-type semiconductor region constituting the photoelectric conversion unit. The N-type semiconductor region 202 is a semiconductor region exhibiting the same polarity as that of an electron serving as a signal carrier and constitutes the PN junction with the P-type well 201.

Reference numeral 203 denotes a P-type semiconductor region disposed on the N-type semiconductor region 202. A part of the P-type well 201, the N-type well 202, and the P-type semiconductor region 203 constitute a buried photodiode.

Reference numeral 204 denotes the field region formed from an insulating material. The field region 204 is disposed to electrically isolating adjacent active regions.

Reference numeral 205 denotes the gate electrode of the pixel transistor. A part of the gate electrode 205 is disposed on the active region, and another part is disposed on the field region 204.

Reference numeral 206 denotes a channel stop region. The channel stop region 206 is disposed as a lower portion and a side portion of the field region 204 and suppresses an occurrence of a channel between adjacent active regions, specifically between the first active region and the third active region and between the second active region and the third active region. Furthermore, the channel stop region may have a function of suppressing a dark current at the interface between the field region and the semiconductor region adjacent thereto.

Reference numeral 207 denotes a P-type semiconductor region constituting the potential barrier. The P-type semiconductor region 207 is formed from a semiconductor region having a concentration higher than that of the P-type well 201 and corresponds to the P-type semiconductor region 107 shown in FIG. 1C. The distance D of an impurity concentration peak position in the first semiconductor region from the insulating film interface of the third active region satisfies D≧1 μm. According to such an arrangement, inclusion of carriers between adjacent photoelectric conversion units can be suppressed.

Reference numeral 208 denotes an N-type impurity ion-implanted region disposed as an upper portion of the P-type semiconductor region.

The direction parallel to the linear line II-II is parallel to the channel width direction of the pixel transistor disposed in the third active region. Put another way, the linear line II-II is parallel to the linear line linking the center of the first photoelectric conversion unit and the center of the second photoelectric conversion unit. Consequently, it can also be said that the direction linking the center of the first active region and the center of the second active region is a direction parallel to the channel width direction of the pixel transistor disposed in the third active region. The present invention is especially effective in the case of such a structure. For example, the case where the direction parallel to the linear line II-II is parallel to the channel length is considered as a comparative example. In this case, unintended P-type impurity ions are disposed in the source•drain regions at the same time with the channel portion. In particular, implantation due to sagging of the resist mask occurs easily at an end portion on the field region side of the third active region. This portion becomes the source•drain regions. However, these regions are subjected thereafter to an N-type impurity ion implantation step to form source•drain regions. Therefore, the influence of unintended P-type impurity ions is not significant.

Next, a method for forming key portions of the solid state image pickup device will be described with reference to FIGS. 3A to 3C and FIGS. 4A and 4B. A portion (mainly the third active region), in which the P-type semiconductor region 207 and the N-type impurity ion-implanted region 208 are disposed, between the field regions 204 in the section taken along the line II-II shown in FIG. 1C is explained.

Figure 3A:
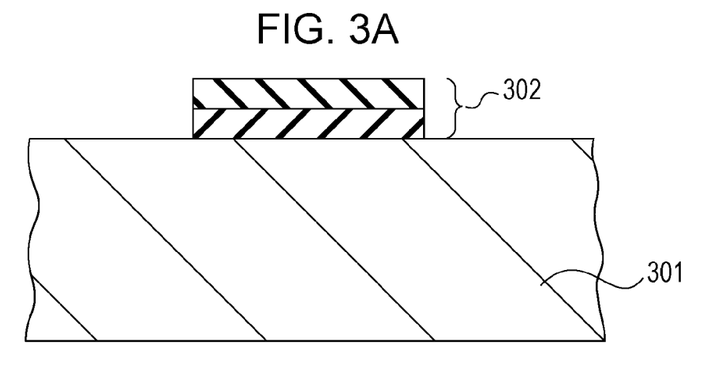
FIGS. 3A to 3C are flow diagrams for explaining a method for manufacturing a solid state image pickup device according to an embodiment of the present invention.

In FIG. 3A, a layered film 302 composed of a silicon oxide film and a silicon nitride film is formed all over a substrate 301. Subsequently, patterning is performed in such a way that the layered film remains in a region nearly corresponding to the active region.

Figure 3B:
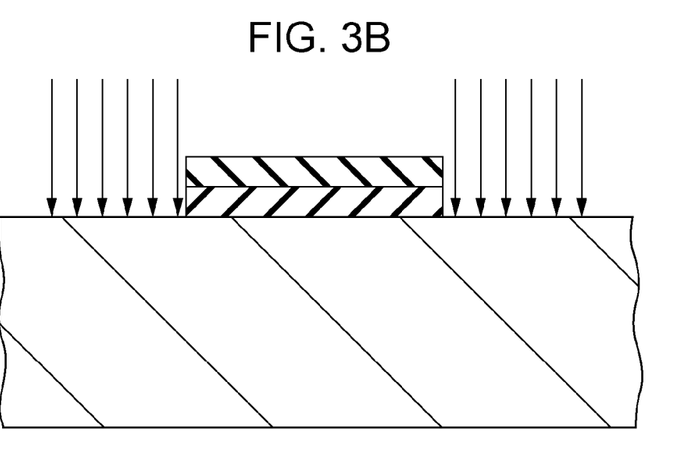

In FIG. 3B, P-type impurity ions are ion-implanted by using at least the layered film 302 as a mask. The present step is a step to form the channel stop region.

Figure 3C:
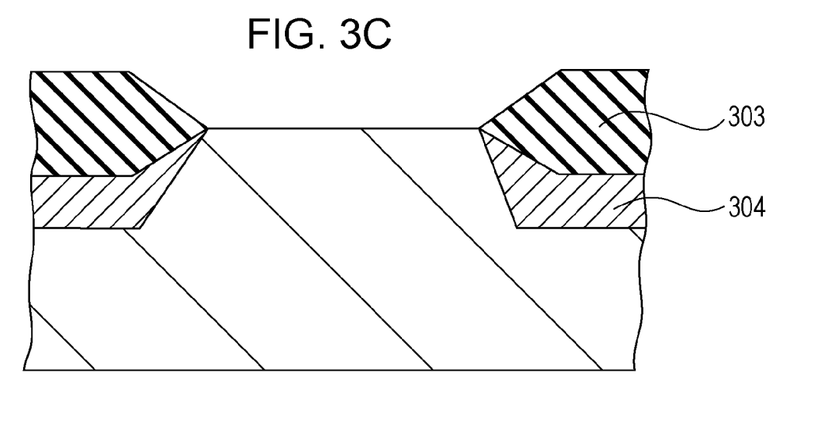

In FIG. 3C, thermal oxidation is performed while the layered film 302 is left, so that a field region 303 is formed. Furthermore, the P-type impurity ions ion-implanted by the step shown in FIG. 3B are activated through this thermal oxidation and, thereby, a channel stop region 304 is formed.

Figure 4A:
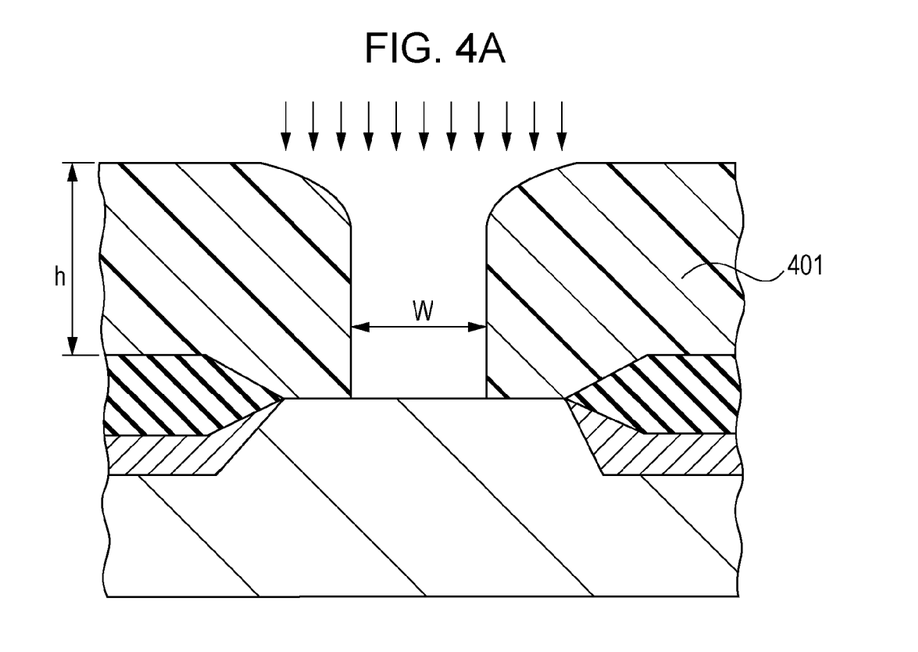
FIGS. 4A and 4B are flow diagrams for explaining a method for manufacturing a solid state image pickup device according to an embodiment of the present invention.

In FIG. 4A, a photoresist film is formed all over the substrate. The film thickness H at this time is about 4 μm. Then, exposure and patterning are performed, so that a resist mask 401 for forming a P-type semiconductor region to provide a potential barrier is formed. As described above, it is clear that sagging of the resist mask occurs at the opening portion. In the case of such a configuration, as described above in detail, changes in characteristics of the pixel transistor from design values occur easily because of P-type impurity ions implanted into the substrate surface incidentally.

Here, in the case where the pixel pitch is reduced, in order to ensure the area and the volume of the photoelectric conversion unit, at least a part of the P-type semiconductor regions 107 and 207 serving as the potential barrier can be disposed immediately under the channel region of the pixel transistor, as shown in FIG. 1C and FIG. 2. Moreover, in order to suppress the influence of the N-type semiconductor region 202 constituting the photoelectric conversion unit 101 on the concentration distribution, the P-type semiconductor regions 107 and 207 serving as the potential barrier can be disposed at a certain distance from the N-type semiconductor region 202 of the photoelectric conversion unit.

Therefore, ion implantation to form the P-type semiconductor regions 107 and 207 serving as the potential barrier is performed from above the region to become a channel of the pixel transistor. Furthermore, in order to suppress the influence of the adjacent photoelectric conversion unit on the concentration distribution, the opening end portion of the resist mask 401 can be disposed on the active region. That is, it can be said that the resist mask is extended from the field region to the end portion on the field region side of the third active region.

The present embodiment is especially effective with respect to the configuration in which the minimum width W of the opening portion of the resist mask 401 satisfies W≦1.4 μm. Here, the minimum width refers to a width in the direction parallel to the direction linking the center of the first photoelectric conversion unit and the center of the second photoelectric conversion unit. That is, the effect is especially high in the case where the ratio of the thickness H of the resist mask to the minimum width W of the opening portion of the resist mask 401, which is the aspect ratio of the opening portion of the resist mask 401, satisfies H/W≧0.28.

The qualitative effect of the present embodiment is more remarkable in the case where the depth of implantation of the P-type impurity ions to form the P-type semiconductor region 207 serving as the potential barrier is deep and the implantation width is small, that is, in the case where the aspect ratio of the mask used in the ion implantation is high.

Ion implantation of the P-type impurity ions is performed by using the above-described resist mask 401. The ion implantation may be performed under a single condition of the ion implantation energy and the amount of dose, or a plurality of times of ion implantation may be performed where at least one of the ion implantation energy and the amount of dose is changed. Here, ion implantation is performed three times where the conditions are different from each other. A desired potential barrier is obtained easily by a plurality of times of ion implantation.

Subsequently, N-type impurity ions are implanted by using the same resist mask 401 with energy lower than the implantation energy in implantation of the P-type impurity ions. This ion implantation is implantation into a region serving as a channel portion of the pixel transistor in the third active region. Since the same resist mask 401 is used, it is possible that an additional mask formation step is made unnecessary. Furthermore, ion implantation of the N-type impurity ions can suppress the above-described influence of incidental ion implantation of P-type impurity ions into the substrate surface. Therefore, use of the same ion implantation mask as that in the P-type impurity ion implantation step has a highest effect in a sense that the influence of unintended P-type impurity ions is suppressed.

In some cases, P-type impurity ions may be further implanted with lower ion implantation energy by further using the resist mask 401.

Figure 4B:
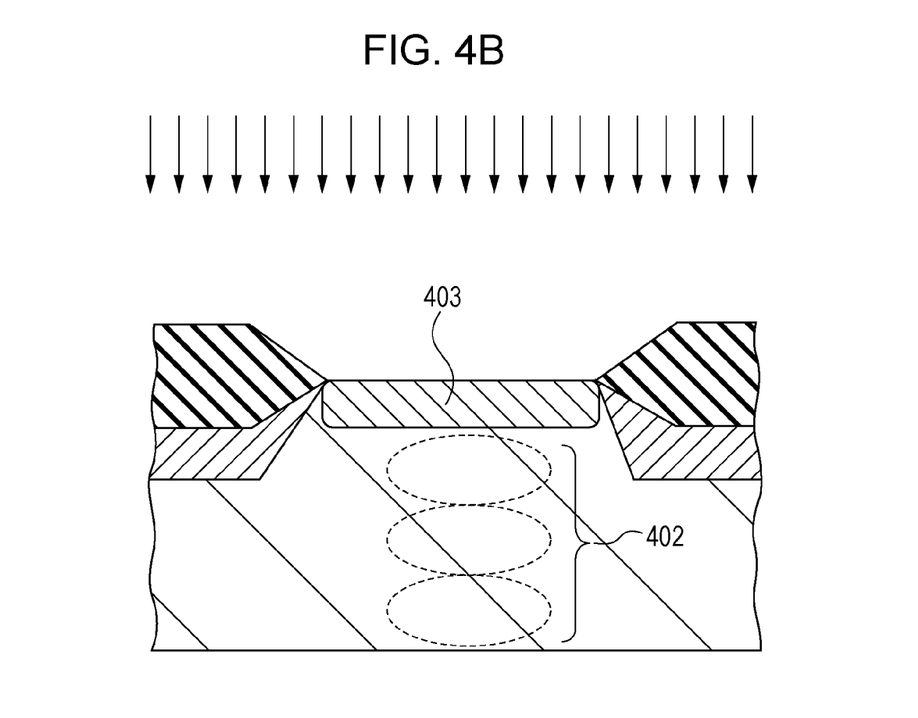

In FIG. 4B, positions of formation of the above-described P-type impurity ions and the N-type impurity ions are shown. Reference numeral 402 denotes a region which is a P-type semiconductor region on a NET concentration basis because of P-type impurity ion implantation. Reference numeral 403 denotes an N-type impurity ion-implanted region. The NET concentration is either P-type or N-type.

Here, the pixel transistor after the N-type impurity ions are implanted into the pixel transistor may become an enhancement type or a depletion type. In the case where the depletion type results, on-of control may be performed by the voltage value supplied to the gate of the transistor, or on-of control may be performed by the potential difference between the source-drain of the transistor. Alternatively, on-of control may be performed by the potential difference between the source-back gate. In the case of a surface channel type, on-off control can be performed by the gate voltage.

As for a comparative example, a method in which the impurity concentration of the P-type well 201 is adjusted is considered as another measure of adjustment of the threshold value of the pixel transistor. However, the P-type well 201 has a significant influence on the potential structure of the photoelectric conversion unit and the transfer structure in transfer of carriers from the photoelectric conversion unit and, therefore, it is not easy to ensure compatibility between these characteristics and the characteristics of the pixel transistor by only design of the P-type well.

According to the present embodiment, changes in characteristics of the pixel transistor, mainly an increase in threshold value, can be achieved without performing, for example, an adjustment of the impurity concentration of the P-type well constituting the photoelectric conversion unit.

Figure 5A:
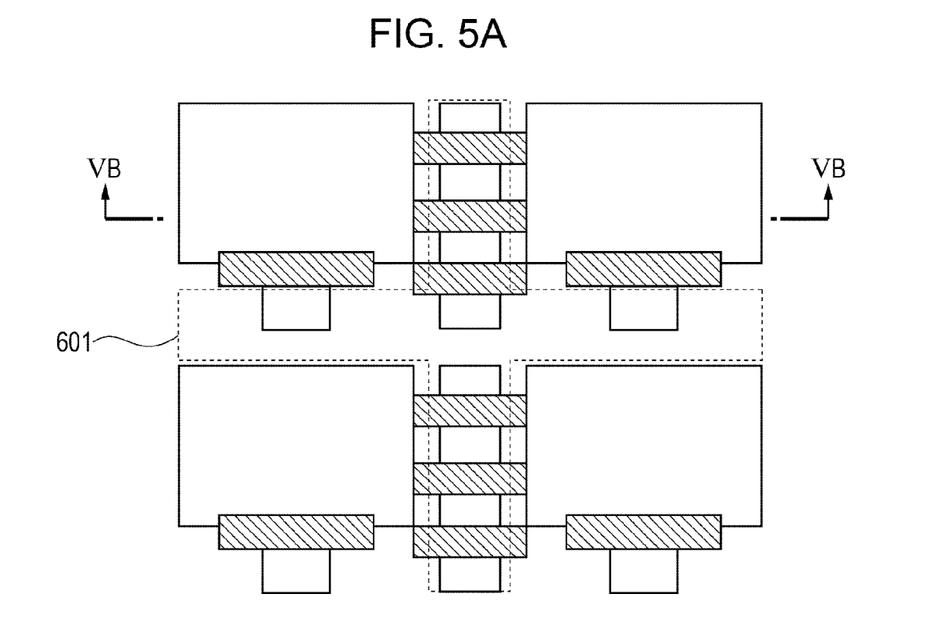
FIGS. 5A and 5B are schematic diagrams of a layout of another form of solid state image pickup device according to an embodiment of the present invention.
Figure 5B:
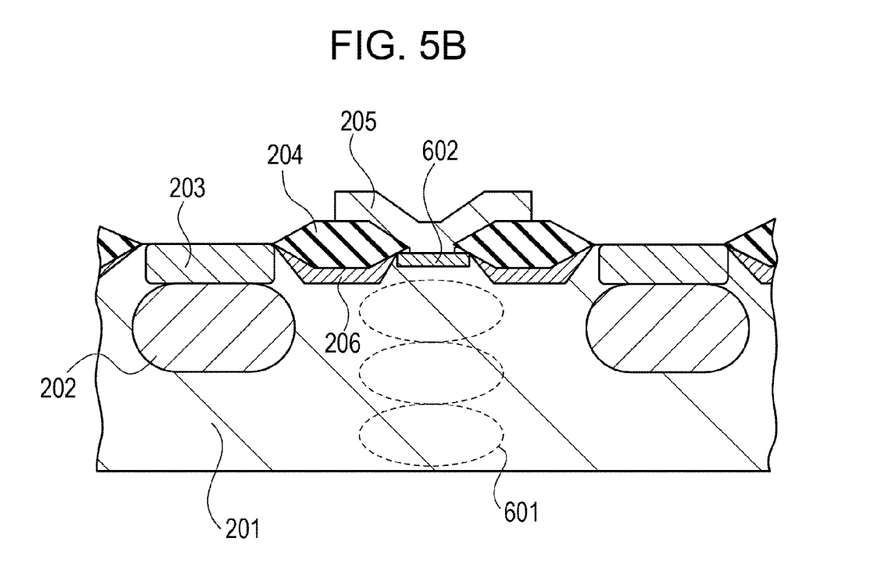

FIGS. 5A and 5B are schematic diagram of a pixel layout in a modified embodiment. FIG. 5A is a plan view, and FIG. 5B is a schematic diagram of the structure of a section taken along a line VB-VB shown in FIG. 5A. The point different from FIG. 1C and FIG. 2 is that a P-type semiconductor region serving as a potential barrier is distributed in a wide region under the pixel transistor. The P-type semiconductor region can wholly cover the portion under the channel region of the pixel transistor, and a part thereof can reach the field region. The portions having the same functions as those in FIG. 1C and FIG. 2 are indicated by the same reference numerals as those set forth above and detailed explanations thereof will not be provided.

Reference numeral 601 denotes a P-type semiconductor region disposed between adjacent photoelectric conversion units. The P-type semiconductor region 601 serves as a potential barrier against signal carriers. Here, the P-type semiconductor region 601 is formed from three semiconductor regions disposed at different depths.

In the manufacturing method shown in FIGS. 4A and 4B, the end of the opening portion of the resist mask is disposed on the third active region. In contrast to that, in the present modified embodiment, the end of the opening portion of the resist mask is disposed on the field region.

Reference numeral 602 denotes an N-type impurity ion-implanted region disposed on the P-type semiconductor region 601. The N-type impurity ion-implanted region 602 can be formed by using the same mask as the mask used in formation of the P-type semiconductor region 601. In this case, ion implantation into the pixel transistor channel portion is regulated not by the resist mask, but by the field region, e.g., LOCOS and STI. Consequently, N-type impurity ions are implanted into the whole channel region.

Up to this point, explanations have been made with reference to the embodiments. However, the present invention is not limited to the above-described embodiments, and modification and addition can be made appropriately within the bounds of not exceeding the gist of the invention. For example, in the embodiments, the case where the electron is used as the signal carrier has been explained, but it is possible to apply to the configuration by using a hole. In this case, the conductivity type of each semiconductor region is changed to a reverse conductivity type.

In the above-described embodiments, the P-type semiconductor regions 207 and 601 and the N-type impurity ion-implanted regions 208 and 602 are disposed with respect to all pixel transistors in the same manner. However, a different manner may be employed in accordance with desired characteristics of the pixel transistor. For example, it is considered that an amplifying transistor is specified to be a buried channel to suppress the 1/f noise and the other pixel transistors are specified to be surface type channels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-033854 filed Feb. 18, 2010, which is hereby incorporated by reference herein in its entirety.

What is claimed is:

1. A method for manufacturing a solid state image pickup device including:
a plurality of pixels, each including
a conversion unit to generate signal carriers and
at least one pixel transistor to read signals based on the generated signal carriers,
a first active region provided with a first conversion unit,
a second active region provided with a second conversion unit, and
a third active region adjoining the first and the second active regions with a field region therebetween and being provided with the pixel transistor, the method comprising:

implanting first conductivity type impurity ions into the third active region in order to form a semiconductor region serving as a potential barrier against the signal carriers; and implanting second conductivity type impurity ions with energy lower than an implantation energy of the implanting of the first conductivity type impurity ions into a region serving as a channel portion of the pixel transistor in the third active region, wherein the first conductivity type is opposite of the second conductivity type, and wherein the channel portion of the pixel transistor is provided between a source region and a drain region of the pixel transistor.

2. The method according to claim 1, wherein the implanting of the first and second conductivity type impurity ions are performed by using a same mask.

3. The method according to claim 1, wherein a mask used in the implanting of the first conductivity type impurity ions is extended from the field region to an end portion on the field region side of the third active region.

4. The method according to claim 1, wherein $H/W \geq 2.8$ is satisfied, where a thickness of a mask used in the ion-implanting of the first conductivity type impurity ions is H and a minimum width of an opening portion, which corresponds to the third active region, of the mask is W.

5. The method according to claim 1, wherein a direction linking a center of the first active region and a center of the second active region is a direction parallel to a channel width direction of the pixel transistor disposed in the third active region.

6. A solid state image pickup device comprising:
a plurality of pixels, each including
a conversion unit to generate signal carriers and
at least one pixel transistor to read signals based on the generated signal carriers;
a first active region provided with a first conversion unit;
a second active region provided with a second conversion unit; and
a third active region adjoining the first and the second active regions with a field region therebetween and being provided with the pixel transistor,
wherein a first conductivity type first semiconductor region serving as a potential barrier against the signal carriers is disposed at a predetermined depth in the third active region,
second conductivity type impurity ions are disposed at a position shallower than a position of the first semiconductor region and in a channel portion of the pixel transistor disposed in the third active region,
the first conductivity type is opposite of the second conductivity type, and
the channel portion of the pixel transistor is disposed between a source region and a drain region of the pixel transistor.

7. The device according to claim 6, wherein a distance D of an impurity concentration peak position in the first semiconductor region from an insulating film interface of the third active region satisfies $D \geq 1$ μm.

8. The device according to claim 6, wherein a direction linking a center of the first active region and a center of the second active region is a direction parallel to a channel width direction of the pixel transistor disposed in the third active region.

9. The device according to claim 6, wherein:
the first semiconductor region is formed by implanting first conductivity type impurity ions into the third active region, and
second conductivity type impurity ions are disposed by implanting second conductivity type impurity ions with energy lower than an implantation energy of the implanting of the first conductivity type impurity ions.

10. The method according to claim 1, wherein a distance D of an impurity concentration peak position in the first semiconductor region from an insulating film interface of the third active region satisfies $D \geq 1$ μm.

11. The method according to claim 1, wherein the field region includes an insulator portion.

12. The method according to claim 11, further comprising:
forming a channel stop region of the first conductivity type under the insulator portion of the field region.

13. The method according to claim 1, wherein the field region includes an STI portion or a LOCOS portion.

14. The method according to claim 1,
wherein the pixel further includes a transfer transistor and a floating diffusion region, and
the transfer transistor is configured to transfer the signal carriers to the floating diffusion region.

15. The method according to claim 1, wherein the pixel transistor includes at least any one of an amplifying transistor, a selection transistor and a reset transistor.

16. The method according to claim 1, wherein the implanting first conductivity type impurity ions includes a plurality of times of implantation with different implantation energies from each other.

17. The device according to claim 6, wherein the field region includes an insulator portion.

18. The device according to claim 6, further comprising:
a channel stop region of the first conductivity type disposed under an insulator portion of the field region.

19. The a device according to claim 6, wherein the field region includes an STI portion or a LOCOS portion.

20. The device according to claim 6,
wherein the pixel further includes a transfer transistor and a floating diffusion region, and
the transfer transistor is configured to transfer the signal carriers to the floating diffusion region.

21. The device according to claim 6, wherein the pixel transistor includes at least any one of an amplifying transistor, a selection transistor and a reset transistor.

22. A method for manufacturing a solid state image pickup device including:
a semiconductor substrate,
a photoelectric conversion unit configured to generate a signal carrier, and
at least one pixel transistor configured to read a signal based on a signal carrier generated by the a photoelectric conversion unit,
the method comprising:
implanting a first conductivity type impurity ions into the semiconductor substrate in order to form a semiconductor region serving as a potential barrier against the signal carrier; and
implanting a second conductivity type impurity ions into a region serving as a channel portion of the pixel transistor, with a lower energy than an implantation energy of the implanting of the first conductivity type impurity ions,
wherein the first conductivity type is opposite of the second conductivity type, wherein the channel portion of the pixel transistor is provided between a source region and a drain region of the pixel transistor, and wherein an insulating material is formed between the photoelectric conversion unit and the pixel transistor.

23. The method according to claim 22, wherein the implanting of the first and second conductivity type impurity ions are performed by using a same mask.

24. The method according to claim 22,
wherein the photoelectric conversion portion is provided in a first active region,
the pixel transistor is provided in a second active region,
a field region is provided between the first and second active regions, and
a mask used in the implanting of the first conductivity type impurity ions is extended from the field region to an end portion on the field region side of the second active region.

25. A method for manufacturing a solid state image pickup device including:
a semiconductor substrate,
a photoelectric conversion unit configured to generate a signal carrier, and
at least one pixel transistor configured to read a signal based on a signal carrier generated by the a photoelectric conversion unit and provided in an active region of the semiconductor substrate, the method comprising:

implanting a first conductivity type impurity ions into the active region, where the pixel transistor is to be or has been provided; and implanting a second conductivity type impurity ions into a region serving as a channel portion of the pixel transistor, with a lower energy than an implantation energy of the implanting of the first conductivity type impurity ions, wherein the first conductivity type is opposite of the second conductivity type, wherein the channel portion of the pixel transistor is provided between a source region and a drain region of the pixel transistor, and wherein an insulating material is formed between the photoelectric conversion unit and the pixel transistor.

* * * * *